United States Patent [19]
Suzuki et al.

[11] Patent Number: 5,365,051
[45] Date of Patent: Nov. 15, 1994

[54] PROJECTION EXPOSURE APPARATUS

[75] Inventors: Hiroyuki Suzuki; Osamu Furukawa, both of Tokyo, Japan

[73] Assignee: Nikon Corporation, Tokyo, Japan

[21] Appl. No.: 92,448

[22] Filed: Jul. 14, 1993

[30] Foreign Application Priority Data

Jul. 20, 1992 [JP] Japan .................................. 4-191766

[51] Int. Cl.$^5$ .......................................... G01N 21/86
[52] U.S. Cl. .................................. 250/201.2; 250/548
[58] Field of Search ................. 250/548, 557; 356/400, 356/401; 364/491

[56] References Cited

U.S. PATENT DOCUMENTS

| | | | |
|---|---|---|---|
| 4,780,617 | 10/1988 | Umatate et al. | 250/548 |
| 4,801,208 | 1/1989 | Katoh et al. | 250/548 |
| 4,833,621 | 5/1989 | Umatate | 364/491 |
| 4,952,815 | 8/1990 | Nishi | 250/548 |

*Primary Examiner*—David C. Nelms
*Assistant Examiner*—K. Shami
*Attorney, Agent, or Firm*—Shapiro and Shapiro

[57] ABSTRACT

A projection exposure apparatus has a structure in which the deviation in a focusing direction between a portion on a wafer which a focus sensor detects during exposure and a desired portion in a shot area is detected, and an offset corresponding to the deviation detected is applied to the focus sensor.

5 Claims, 6 Drawing Sheets

PROJECTION EXPOSURE APPARATUS

BACKGROUND OF THE INVENTION

1. Field of the Invention

The present invention relates to an apparatus, such as a projection exposure apparatus, which requires a focusing operation with respect to a substrate (photosensitive substrate) to be processed and, more particularly, to a technique of performing a focusing operation reliably for a substrate to be processed on which the undulations of a processing area are uneven.

2. Related Background Art

Conventionally, some projection exposure apparatuses for exposing the pattern of an integrated circuit onto the surface of a semiconductor wafer or the like adopt an optical focus position shift detecting method in order to match the wafer surface accurately with a predetermined exposure plane. As one type of this optical focus position shift detecting method, there has been provided a method of obliquely radiating a light beam with an elongated section downward onto a wafer as a surface to be detected, converging reflected light components of the light beam through a vibrating slit, and detecting a focus position by using an output obtained by photoelectrically converting the converged light signal and electrically processing the converted signal. The detecting light beam used in this focus position shift detection, however, is constantly radiated onto a predetermined position of a wafer at rest. Therefore, although a focusing operation can be performed on a local plane at an irradiated position, if a surface with a height different from that of the plane at the position irradiated with the detecting light beam is present within a projection exposure area (field), this surface does not agree with the focal plane. In this case, an inconvenient situation results if the design rule of the pattern of an integrated circuit on the surface at the level different from that of the plane at the irradiation position of the detecting light beam is severest in the projection exposure area and an in-focus state must be obtained on that surface.

Recently, the development of high-NA projection exposure lenses has advanced with a reduction in the line widths of IC patterns, and this consequently has decreased the margin for the depth of focus. If, therefore, the levels of individual circuit patterns within a projection exposure area are uneven, it is desirable that a focusing operation be performed in accordance with a circuit pattern requiring a minimum focus position shift, among other circuit patterns.

For this reason, in conventional apparatuses, the difference in level between a plane at a position irradiated with a detecting light beam used in focus position shift detection and a plane at a position of a certain circuit pattern requiring a minimum focus position shift is designated beforehand as a focus offset amount. When a focal point is to be actually matched with the plane at the irradiation position of the detecting light beam, the focus offset amount designated beforehand is corrected by electrical processing. In this method, however, the focus offset amount must be measured in advance.

It is also possible to perform a method (focus lock) in which a focusing operation is performed by moving the irradiation position of a detecting light beam used in detection of a focus position shift to the position of a circuit pattern requiring a minimum focus position shift, and then exposure is performed by moving the irradiation position to a projection exposure position while the obtained focal point is maintained. This method, however, has a drawback that the processing time increases each time the exposure processing is performed.

Even when, on the other hand, an alignment sensor performs an alignment operation with respect to an alignment mark on a substrate to be processed, a position irradiated with a detecting light beam used in focus position shift detection is generally different from the position of the alignment mark. Therefore, similar problems arise if the level of a plane at the irradiation position of the detecting light beam is different from that of a plane at the position of the alignment mark.

SUMMARY OF THE INVENTION

It is an object of the present invention to efficiently perform a focusing operation for a substrate to be processed, on which the undulations of a processing area are uneven, in a projection exposure apparatus of, e.g., a step-and-repeat type or a step-and-scan type.

The technical feature of the present invention, therefore, is that the difference in level between a plane at a focus detection position within a projection exposure area and a plane which is present in this projection exposure area and requires an optimum in-focus state is measured automatically, and, if this measurement is performed a plurality of number of times, the measured values are averaged and stored, and correction is performed by the amount of this average value when projection exposure is performed. The technical feature in alignment, on the other hand, is that the difference in level between a plane at a focus detection position and a plane at the position of an alignment mark is measured automatically when alignment is performed, and, if this measurement is performed a plurality of number of times, the measured values are averaged and stored, and correction is performed by the amount of this average value during alignment measurement.

In the present invention, a positional deviation (in-shot focus deviation) in the direction of an optical axis is obtained between a position (first position), which is present within one exposure area (a local area or shot area) on a photosensitive substrate (wafer) and in the vicinity of the optical axis of a projection optical system when exposure is performed, and at least one second position present in the exposure area and apart from the first position by a predetermined distance in a predetermined direction. Of the in-shot focus deviations obtained in each of several (n) selected exposure areas, m (two or more) in-shot focus deviations falling within a tolerance are selected and averaged. Therefore, the average value thus calculated corresponds to the step between the central portion of the shot and a given portion (at which a focusing operation must be performed precisely) within the shot. An ordinary surface position detecting means performs focus detection only on the central portion of a shot (or at a particular point in the shot) when exposure is performed. When, therefore, an offset amount corresponding to the step (average value) is added to the detected focus position, a best image plane (conjugated plane with respect to a mask) accurately agrees with the portion in the shot, which requires a precise focusing operation.

According to the present invention as described above, an optimum focusing operation can be performed by using a correction value calculated in advance even if an optimum focusing operation cannot be performed at a projection exposure position. In addition, since this correction value can be measured and calculated automatically, the work efficiency can be improved. Furthermore, even if an optimum focusing operation cannot be performed at an alignment position, it can be performed by using a precalculated correction value. Since this correction value can be measured and calculated automatically, it is possible to improve the work efficiency. Moreover, according to the present invention, measurement for determining the best focus position in accordance with the flatness in a shot area to be projection-exposed can be executed simultaneously with an alignment operation, so a reduction in the throughput can also be prevented.

DETAILED DESCRIPTION OF THE PREFERRED EMBODIMENTS

Figure 1:
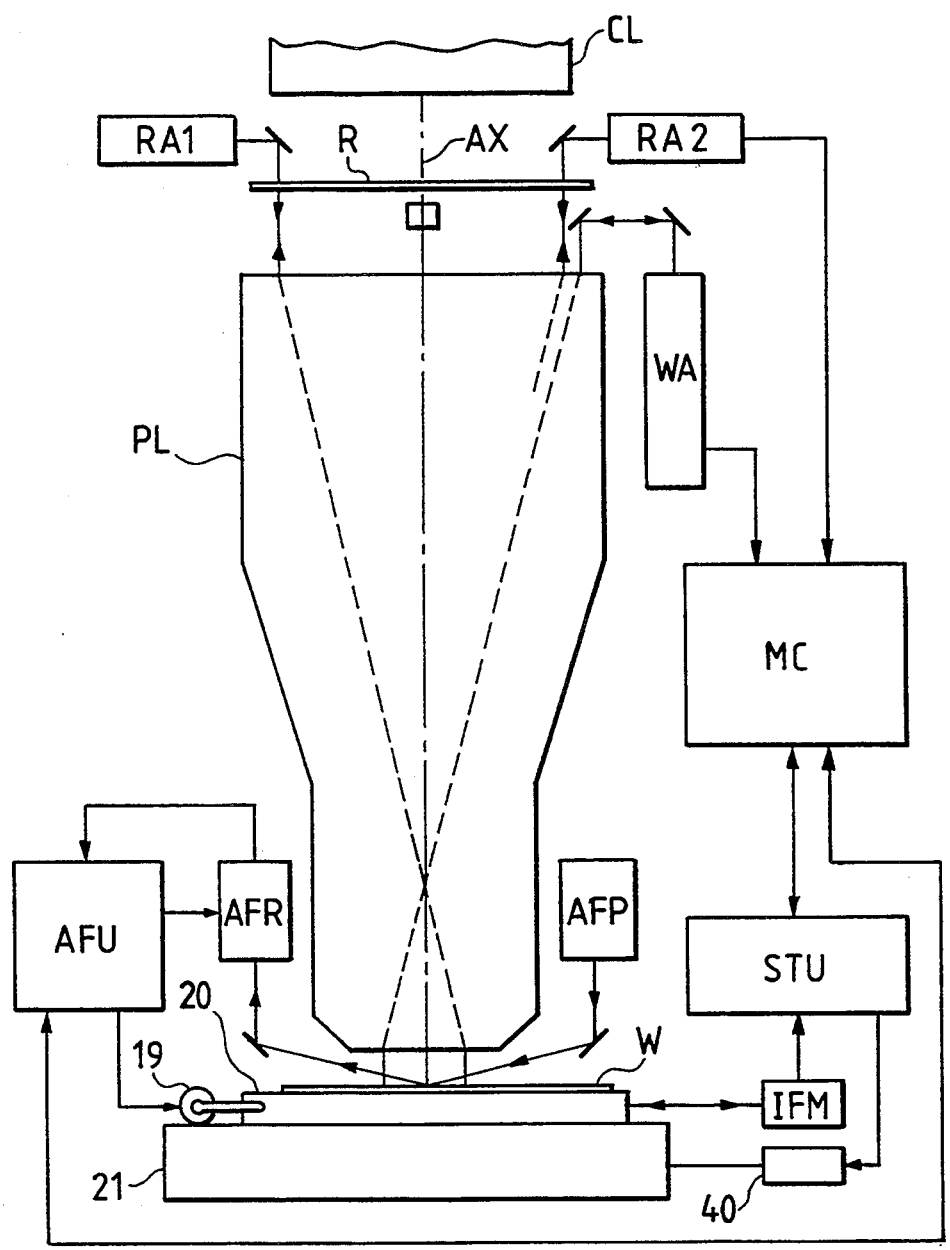
FIG. 1 is a view showing the overall arrangement of a projection exposure apparatus to which the present invention is applied.

FIG. 1 shows the overall arrangement of a projection exposure apparatus (stepper) to which the present invention is applied. A pattern area formed on a reticle (mask) R is uniformly irradiated with illumination light from a condenser lens CL of an exposure illumination system. Light transmitted through the pattern area reaches a wafer W through a projection lens PL having telecentric lens surfaces on both sides or a telecentric lens surface on the image side, projecting the image of the pattern area onto a predetermined shot area on the wafer W. Reticle alignment microscopes $RA_1$ and $RA_2$ detect marks formed in the peripheral portion of the reticle R to align the reticle R with an optical axis AX of the projection lens PL, or detect the positional shift amounts of the marks on the reticle R relative to marks on the wafer W to align the reticle R with the wafer W. A TTL (through the lens) alignment system WA serves to detect the marks on the wafer W through only the projection lens PL. The TTL alignment system WA has a mark detection area which is located inside the projection field of the projection lens PL and outside the projection range of the pattern area of the reticle R. Two such identical TTL alignment systems WA are arranged such that their mark detection areas are set at two positions within the projection field.

The wafer W is held on a Z stage 20 which is held on an XY stage 21. The Z stage 20 is designed to be finely moved in the direction (Z direction) of the optical axis AX with respect to the XY stage 21 by a driving system such as a motor 19. With this arrangement, a focusing operation is performed such that the upper surface of the wafer W is matched with the best image plane of the projection lens PL. The position on the upper surface of the wafer W in the optical axis AX direction is detected by an oblique incident type focus detection system. Non-exposure light from a light-emitting element AFP is obliquely incident on the wafer W, and the reflected light is received by a light-receiving element AFR. A detection signal (a signal changing its state in accordance with the magnitude of a focus shift) from the light-receiving element AFR is supplied to a focus control system AFU. On the basis of this detection signal, the focus control system AFU sequentially detects the focus shift amount of the upper surface of the wafer W relative to the best image plane, and drives the motor 19 for the Z stage 20 until the focus shift amount falls within a predetermined tolerance.

The wafer W is exposed by a step-and-repeat scheme, in which the stepping position is detected as a two-dimensional coordinate value by a laser interferometer IFM. The laser interferometer IFM detects a coordinate position in a moving plane (X-Y plane) of the wafer W with a resolution of about 0.01 µm. The laser interferometer IFM is also used in mark position measurement and the like. A motor 40 for moving the XY stage 21 (i.e., the wafer W) in the X and Y directions is controlled by a stage control system STU. Upon receiving data of the target position of movement of the wafer W from a main control system MC, the stage control system STU calculates the difference between the target position and the current position measured by the laser interferometer IFM. The stage control system STU then drives the motor 40 at an optimum speed corresponding to the difference, performing servo control of the motor 40 such that the count value of the laser interferometer IFM falls within the range of, e.g., $\pm 5$ ($\pm 0.05$ µm) with respect to the target position.

The main control system MC receives, e.g., the measurement results obtained by the reticle alignment microscopes $RA_1$ and $RA_2$ and the mark position measurement result obtained by the TTL alignment system WA, and exchanges data and commands with the focus control system AFU. In this embodiment, part particularly related to the present invention is an operation in which the main control system MC sends focus offset data to the focus control system AFU and the focus control system AFU sets a focus offset in the light-receiving element AFR on the basis of the supplied focus offset data.

Figure 2:
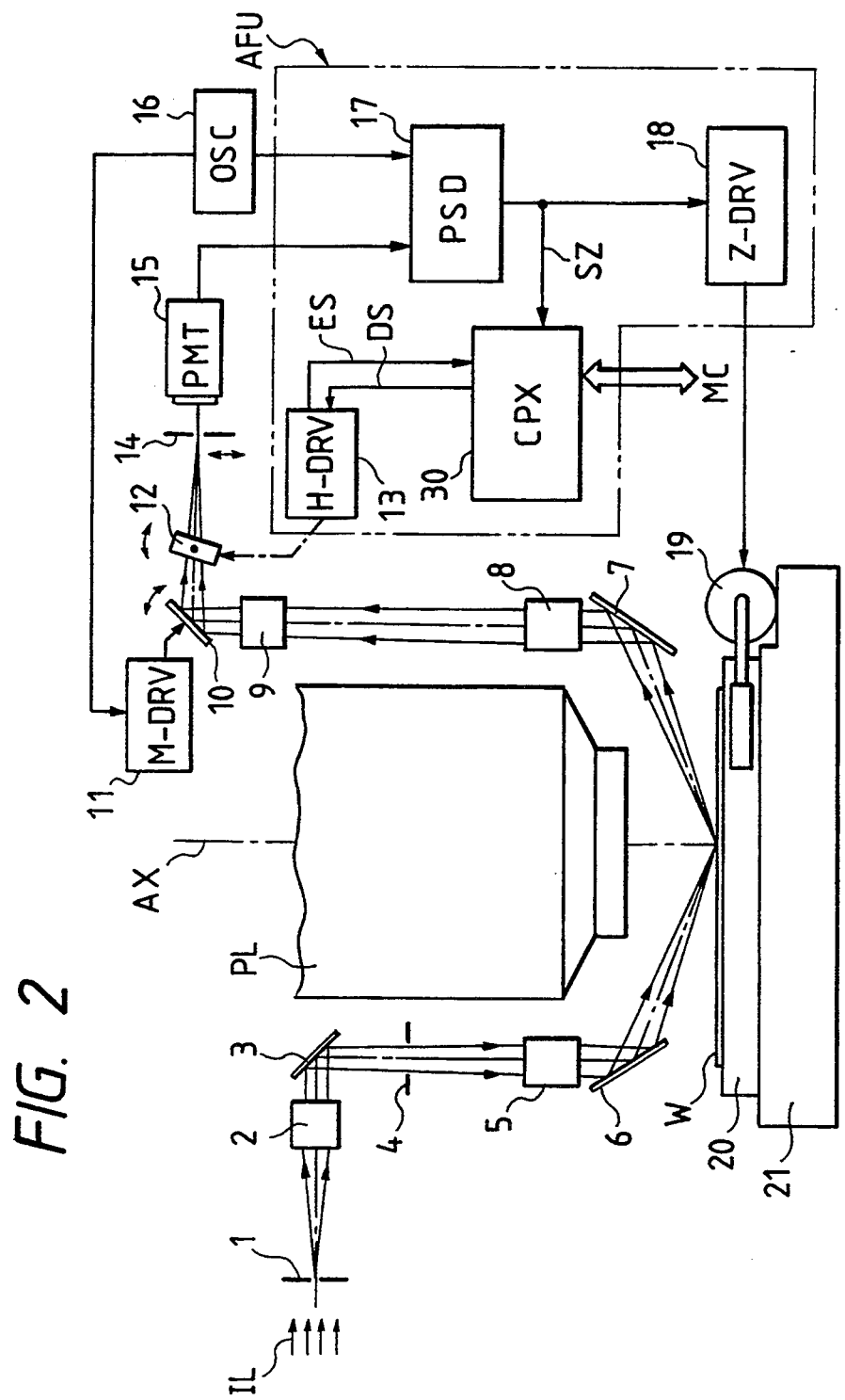
FIG. 2 is a view showing the arrangements of an oblique incident-type focus position detecting system and its control system provided in the apparatus shown in FIG. 1.

FIG. 2 shows the detailed arrangements of the focus control system AFU, the light-emitting element AFP, and the light-receiving element AFR in FIG. 1. A slit 1 is illuminated with broad-band illumination light IL having a band in a red or infrared range. Light from the slit 1 is obliquely projected onto the upper surface of the wafer W through a lens system 2, a mirror 3, an aperture stop 4, an objective lens 5, and a mirror 6. At this time, the image of the slit 1 is formed on the wafer W. The reflected light of this slit image is again formed on a detection slit 14 via a mirror 7, an objective lens 8, a lens system 9, a vibration mirror 10, and a variable-angle plane parallel glass (to be referred to as a plane parallel hereinafter) 12. A photo-multiplier 15 photoelectrically detects the light beam of the slit image transmitted through the slit 14 and outputs the resulting photoelectric signal to a synchronization detector (PSD) 17.

The vibration mirror 10 is vibrated within a predetermined angle range by a driving circuit (M-DRV) 11 in response to a sine-wave signal with a predetermined frequency supplied from an oscillator (OSC.) 16. With this operation, the image of the slit 1 formed on the detection slit 14 is finely vibrated in a direction perpendicular to the longitudinal direction of the slit, modulating the photoelectric signal from the photo-multiplier 15 in accordance with the frequency of the OSC. 16. The PSD 17 performs phase detection for the photoelectric signal from the photo-multiplier 15 on the basis of an original signal from the OSC. 16, and outputs a resultant detection signal SZ to a processing circuit (CPX) 30 and a driving circuit (Z-DRV) 18 for driving the motor 19 for the Z stage 20. The detection signal SZ has zero level when the upper surface of the wafer W is matched with the best image plane (reference plane), positive level when the wafer W is displaced upward from the matched state along the optical axis AX, and negative level when the wafer W is displaced in the opposite direction. If, therefore, the Z-DRV 18 is a servo amplifier based on zero level, the Z-DRV 18 drives the motor 19 such that the detection signal SZ goes to zero level. This consequently achieves auto focus of the wafer W.

The processing circuit (CPX) 30 reads in the level of the detection signal SZ and outputs a drive signal DS to a driving section (H-DRV) 13 for adjusting the inclination of the plane parallel 12 with respect to the optical axis. The H-DRV 13 incorporates a driving motor and an encoder for monitoring the inclination amount of the plane parallel 12. An up/down pulse output ES from the encoder is fetched by the CPX 30.

Figure 3:
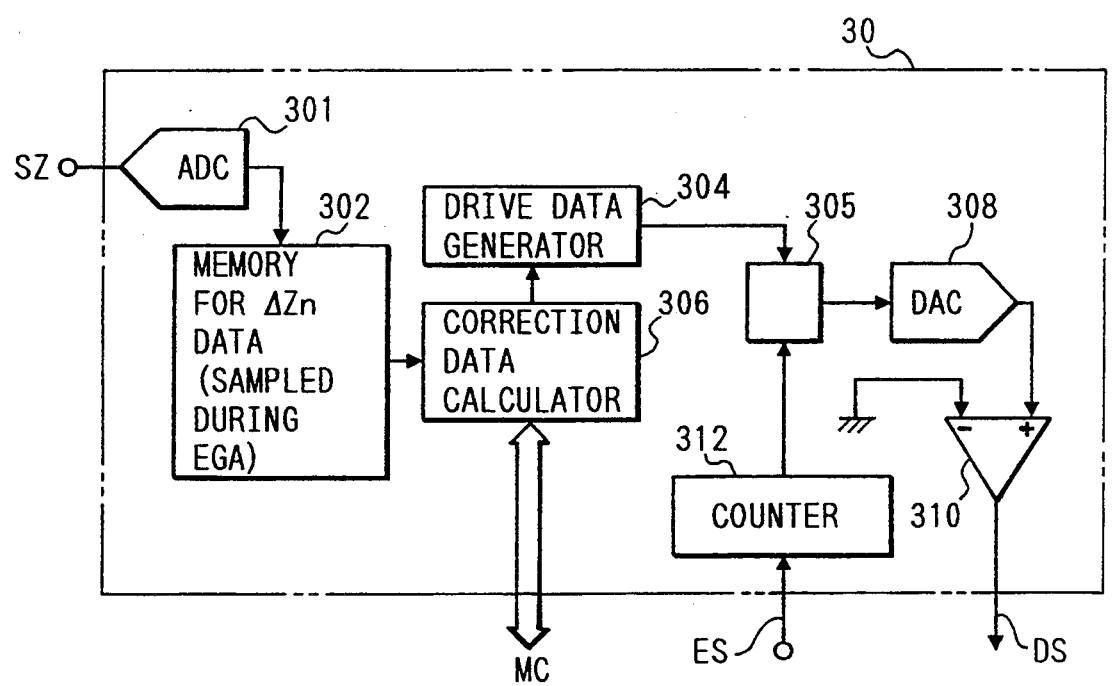
FIG. 3 is a block diagram showing the arrangement of a processing system shown in FIG. 2.

FIG. 3 shows the detailed arrangement of the CPX 30. The level of the detection signal is converted into a digital value by an analog-to-digital converter (ADC) 301 and stored in a memory 302. The data stored in the memory 302 is processed by a correction data calculator 306 and a drive data generator 304, and the resulting inclination amount of the plane parallel 12, which corresponds to a focus offset amount, is output to a subtracter 305. A counter 312 counts up/down encoder outputs ES and outputs the current value of the angle of inclination of the plane parallel 12 to the subtracter 305. The subtracter 305 calculates the difference between the data from the generator 304 and the output from the counter 312 and outputs the difference to a digital-to-analog converter (DAC) 308. The DAC 308 supplies the converted analog level to a servo amplifier 310, and the amplifier 310 outputs the drive signal DS of the plane parallel 12.

In the above arrangement shown in FIG. 3, the memory 302, the correction data calculator 306, the drive data generator 304, and the subtracter 305 are realized by the programs of a computer. These components, therefore, sometimes execute their respective related operations in addition to the operations for achieving the above functions. Although a practical operation of the correction data calculator 306 will be described in detail later, the principal function of the calculator 306 is to calculate the focus offset amount in association with the present invention.

Figure 4A:
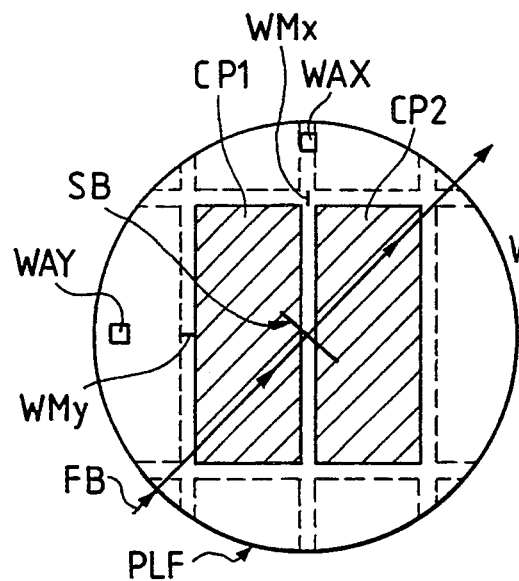
FIGS. 4A, 4B, 4C, and 4D are views showing various states of a shot area on a wafer, each of which appears in the projection field of a projection optical system.

FIGS. 4A to 4D show the surface structures of the wafer appearing in a projection field PLF of the projection lens PL. FIG. 4A shows a state when the pattern of the reticle R is overlayed on the shot area on the wafer W and exposed. Assume that two chip areas CP1 and CP2 are formed on both sides of a street (scribe) line in one shot area on the wafer W and two chip patterns are also formed on both sides of the street line correspondingly in the pattern area on the reticle R. An imaging light beam FB from the light-emitting element AFP of the focus position detection system is incident on a central portion (through which the optical axis AX passes) of the projection field PLF in a direction inclined by 45° C. from both the X and Y axes in the X-Y plane, forming an image SB of the light-transmitting slit 1 on the wafer W. This slit image SB is set to have a size (several hundred $\mu$m to several mm) much smaller than the entire area (diameter) of the projection field PLF. In the state shown in FIG. 4A, the slit image SB is projected onto the street line between the chip areas CP1 and CP2. Wafer marks WMx and WMy in the X and Y directions, respectively, to be detected by the wafer alignment system WA are formed in one shot area on the wafer W. In addition, a detection area WAX of the X-direction wafer alignment system WA and a detection area WAY of the Y-direction wafer alignment system WA are set at two positions of the peripheral portion within the projection field PLF. These detection areas WAX and WAY correspond to the projection areas of spots of a laser beam in a system in which the wafer alignment system WA projects a laser beam in the form of spots (about several $\mu$m to 1 mm) onto a wafer, and correspond to the imaging areas of a television camera (CCD) in a system in which mark images are detected by using the television camera.

In the exposure state as shown in FIG. 4A, the wafer mark WME and the detection area WAX are shifted from each other in the Y direction, and the wafer mark WMy and the detection area WAY are shifted from each other in the X direction. This is so because part (e.g., the mirror) of the optical system of the wafer alignment system WA is arranged at a position of the projection field PLF as peripheral as possible so as not to enter the projection area of the reticle pattern. Note that when the reticle alignment systems RA1 and RA2 shown in FIG. 1 are so designed as to detect the wafer marks by a die-by-die scheme, the positions of the reticle alignment systems RA1 and RA2 are set such that the detection areas WAX and WAY coincide with the marks WMx and WMy in the exposure state shown in FIG. 4A.

Figure 4B:
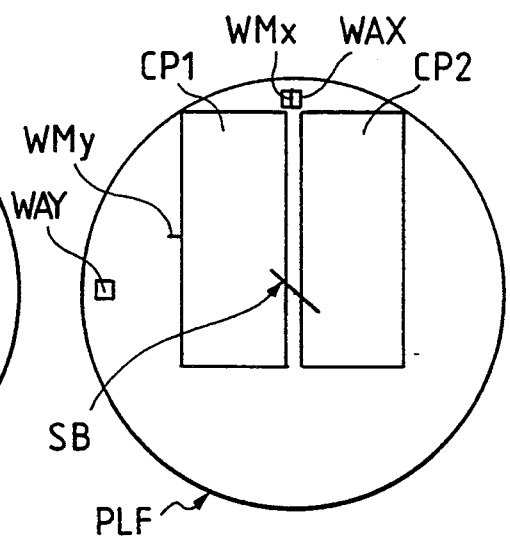

FIG. 4B illustrates a state in which the wafer mark WMx is detected by the detection area WAX of the X-direction wafer alignment system. Referring to FIG. 4B, the XY stage 21 is shifted by a predetermined amount in the Y direction from the state shown in FIG. 4A. In this state, the slit image SB formed by the focus position detection system is projected onto the street line between the chip areas CP1 and CP2.

Figure 4C:
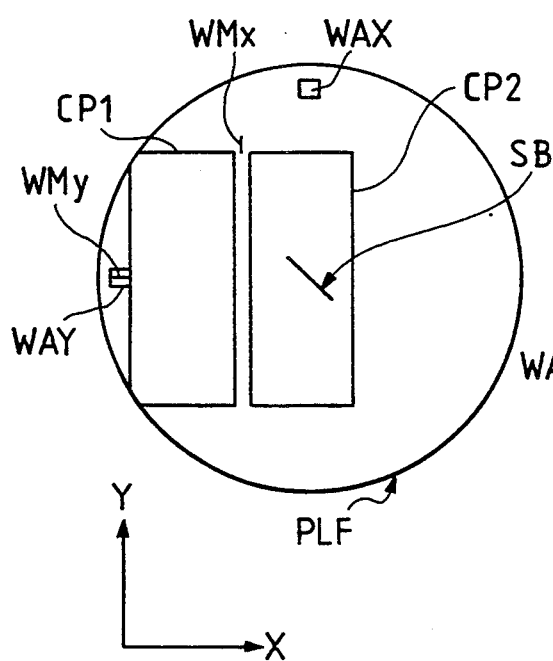

FIG. 4C shows a state in which the wafer mark WMy is detected by the detection area WAY of the Y-direction wafer alignment system. Referring to FIG. 4C, the XY stage 21 is shifted by a predetermined amount in the X direction from the state shown in FIG. 4A. In this state, the slit image SB formed by the focus position detection system is located at substantially the center of the chip area CP2. When a plurality of chips are to be arranged in one shot, these chips are generally formed to have the same pattern structure. Therefore, the formation of the slit image SB at the central portion of the chip area CP2 means that the focus position detection system (AFP, AFR) can representatively detect all the levels of the surfaces in the same chip area formed on the wafer W.

Figure 4D:
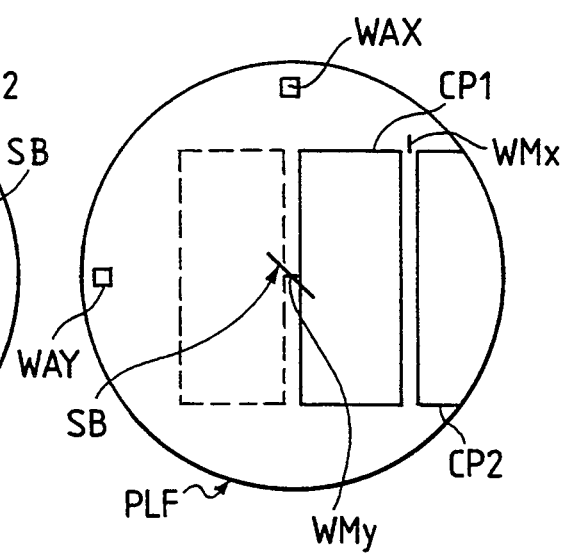

FIG. 4D illustrates a state in which the XY stage 21 is positioned such that the wafer mark WMy is arranged at the central portion (the position of the slit image SB) of the projection field PLF. Since the wafer marks WMy and WMx are formed in the street lines surrounding the chip area, the level of the wafer surface detected by the focus position detection system in the state shown in FIG. 4D is nearly the same as that detected in the state shown in FIG. 4A. A nearly identical state is also obtained when the wafer mark WMx is arranged at the position of the slit image SB.

Generally, the surface of the chip area CP formed on the wafer W rises to be higher than that of the street line as the process proceeds. In addition, a portion with a large step exists depending on the pattern structure in the chip. Therefore, if focus detection (projection of the slit image SB) is constantly performed in the same portion of one shot area on the wafer W, it sometimes becomes impossible to perform an accurate focusing operation under the influence of the step.

In the first embodiment of the present invention, therefore, before the wafer W is exposed by the step-and-repeat scheme, the focus position detection system measures information concerning the flatness in one shot area on the wafer W, thereby performing an optimum focusing operation which reflects the flatness.

Figure 5:
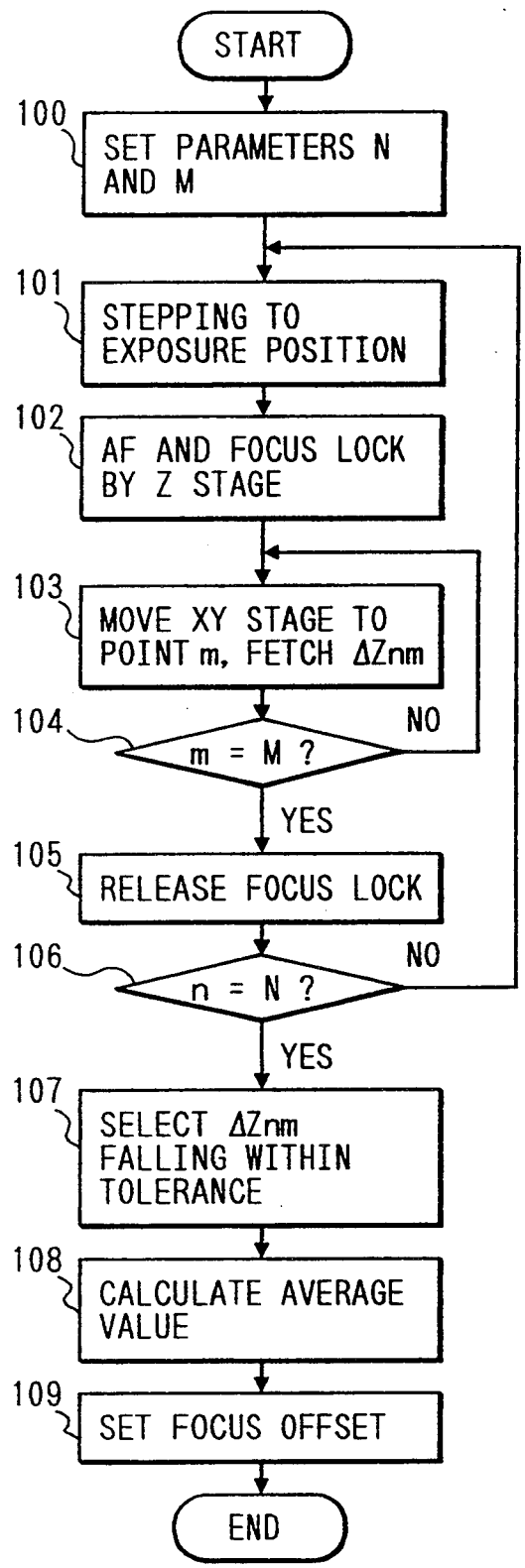
FIG. 5 is a flow chart for explaining the operation according to the first embodiment of the present invention.

FIG. 5 is a flow chart schematically representing the sequence according to the first embodiment. This sequence is executed by the main control system shown in FIG. 1 in cooperation with the CPX 30 (FIG. 3) shown in FIG. 2.

First, on the basis of data indicating the arrangement of a plurality of shot areas formed on the wafer W during step-and-repeat processing, the main control system MC selects several representative shot areas from these shot areas, thereby setting N designated shot areas (step 100). This shot designation may also be executed by an operator. In step 100, a parameter M indicating points of focus detection within one shot area except for the center of the area is set. This parameter M gives the positions and the number of measurement points in one shot area except for the center of the area. Note that the positions of these measurement points need only be defined as shift amounts in the X and Y directions from the center of a shot area, so it is unnecessary to set them for each of the N designated shot areas.

Figure 6:
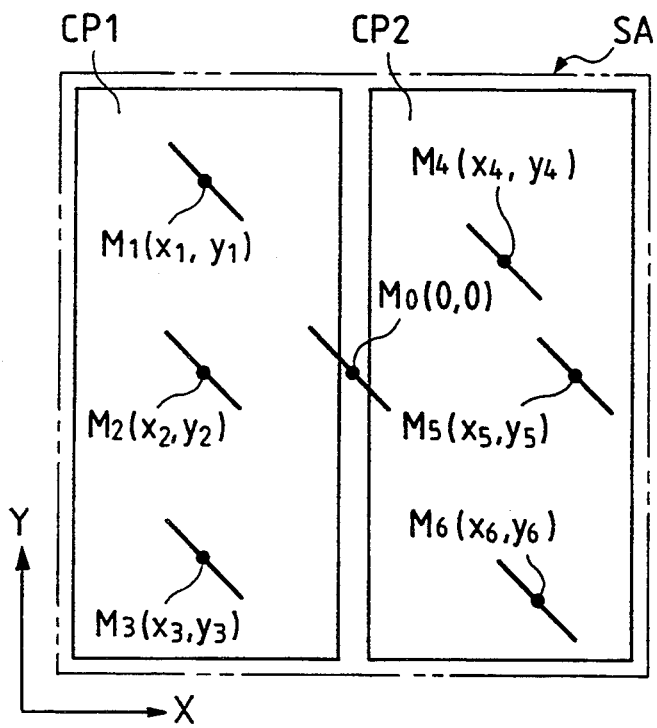
FIG. 6 is a view showing a practical example of the arrangement of a large number of focus measurement points in a shot area.

FIG. 6 shows the way the parameter M is set. When focus position detection is to be performed at the exposure position as shown in FIG. 4A (which is an operation performed for most of shot areas), $M_0$ (0,0) is set as the parameter M. Also in FIG. 6, the two chip areas CP1 and CP2 are handled as one shot area SA. As shown in FIG. 6, when measurement is to be performed at six points in the shot area SA in addition to the center of the area, $M_1(x_1,y_1)$, $M_2(x_2,y_2)$, $M_3(x_3,y_3)$, ..., $M_6(x_6, y_6)$ are also set as the parameter M. The coordinate values $(x_m, y_m)$ of each of the parameters $M_0$ to $M_6$ are defined as shift amounts from the central measurement point $M_0$ (0,0). In FIG. 6, each line passing through the measurement points at an angle of inclination of 45° represents the slit image SB shown in FIGS. 4A to 4D.

In the state shown in FIG. 6, the two chips CP1 and CP2 with the same pattern structure are formed in one shot area SA, and so it suffices to select the measurement points only in one of the chip areas in some cases. In this case, an operator determines a proper arrangement of the measurement points.

When the parameters N and M are determined as described above, the XY stage 21 is stepped to the exposure position with respect to the designated shot area in step 101. In this case, the designated shot area is positioned in the projection field PLF as shown in FIG. 4A. Subsequently, in step 102, a focusing operation is performed for the wafer W by the focus position detection system (1 to 17), the Z-DRV 18, the motor 19, and the Z stage 20 shown in FIG. 2 such that the detection signal SZ has zero level. When the detection signal SZ has zero level, the servo control by the Z-DRV 18 is stopped, and the motor 19 is locked so as not be driven in response to the signal SZ. In this manner, the focusing operation for the central point $M_0$ (0,0) shown in FIG. 6 is achieved.

Subsequently, in step 103, the XY stage 21 is positioned on the basis of the parameter M such that a measurement point m in the shot area SA agrees with the slit image SB formed by the focus position detection system. Since the Z stage 20 does not move in the direction of the optical axis AX, the level of the detection signal SZ from the PSD 17 shown in FIG. 2 coincides with the difference in height between the central point $M_0$ and the first measurement point $M_1$ $(x_1, y_1)$ when the measurement point $M_1$ moves to the position of the slit image SB. The CPX 30, therefore, reads in the level as $\Delta Znm$ by using the ADC 301 shown in FIG. 3 and stores $\Delta Znm$ in the memory 302. When the shift amount $\Delta Znm$ for the first measurement point $M_1$ is stored, the CPX 30 checks in step 104 whether points to measured remain in the shot (m=M?). If points remain in step 104, the operation from step 103 is repeatedly executed.

With the above operation, the shift amount in height, i.e., the flatness of each of the M measurement points in the designated shot area is obtained with respect to the central point $M_0$. Focus lock is then released in step 105, and the CPX 30 checks in step 106 whether all of the N designated shot areas are completely processed (n=N?). If any designated shot areas remains in step 106, the sequence of steps 101 to 105 is repeatedly executed.

In this manner, the flatnesses in a designated shot area are obtained at a plurality of points in that area. If, however, a focusing operation need only be performed accurately for only one particular portion in a shot area, the parameter M is set for that one particular portion in step 100. In addition, if zero is set as the parameter M, the sequence from step 101 is not executed. That is, exposure is performed by executing a focusing operation for only the central point of a shot area as in conventional apparatuses.

The CPX 30 then causes the correction data calculator 306 shown in FIG. 3 to calculate the stored data $\Delta Znm$ indicating the shift amount. Before the calculation, however, the CPX 30 checks in step 107 whether each data $\Delta Znm$ falls within a predetermined tolerance. As an example, this tolerance is set to be twice or more as large as the degree of undulations on the surface expected in one shot. It is, of course, necessary to change the tolerance in accordance with the layer structure formed on the wafer W. It is also necessary to change the tolerance in accordance with the manner (multi die or single die) in which chips are formed in a shot area as shown in FIGS. 4A to 4D and FIG. 6. The selection of the tolerance independent of the layer structure or the way the chips are formed is also possible: one is a method in which the variance value or three δ values) of the measured data $\Delta Znm$ is calculated, and those falling outside this calculated range are rejected; the other is a method in which a simple average value of the data $\Delta Z_{nm}$ is calculated, a predetermined range is determined for this average value (in accordance with the measurement error of the focus position detection system or the like), and those falling outside this range are rejected. In either method, those falling outside the tolerance are rejected from the data $\Delta Z_{nm}$, and the remaining data $\Delta Z_{nm}$ are averaged in step 108.

The average value $\Delta Z$ calculated in step 108 (by the correction data calculator 306) is used to set a focus offset in step 109. The average value $\Delta Z$ is originally obtained as the level of the detection signal SZ. When the focus offset is to be applied in the form of an electrical signal, therefore, an offset voltage equivalent to the average value $\Delta Z$ is applied to an amplifier provided in the output stage of the PSD 17, thereby shifting the level of the output detection signal SZ, or the offset voltage is applied to an amplifier provided in the input stage of the Z-DRV 18, and added to the detection signal SZ from the PSD 17.

When an offset is to be optically applied by the plane parallel 12 as shown in FIG. 2, the CPX calculates the drive amount of the plane parallel 12 by using the drive data generator 304 shown in FIG. 3 and outputs the data to the subtracter 305, thereby controlling the H-DRV 13. When correction of the plane parallel 12 is completed, the output from the DAC 308 in the CPX 30 is forcibly held at zero, or the input to the servo amplifier 310 is forcibly held at zero.

When the sequence shown in FIG. 5 is finished as described above, the main control system MC starts an exposure operation by the step-and-repeat scheme. At this time, the best focus position of the focus position detection system is set at a plane at a level different from the level of the central portion of the shot area. The focus position detection system, therefore, so operates as to match the best image plane with a portion requiring the most precise focusing operation within one shot area.

The second embodiment of the present invention will be described below. Although the basic sequence of this second embodiment is the same as that shown in FIG. 5, a method of determining measurement points M in a designated shot area is different from that of the first embodiment. When overlap exposure is to be performed for a wafer W, it is commonly necessary to detect the positions of marks on the wafer W and position them relative to a reticle R. A wafer alignment system WA shown in FIG. 1 is used in detection of the mark positions. It is desired in this mark detection that each mark be detected in an in-focus state in detection areas WAX and WAY within a field PLF of a projection lens PL.

First, therefore, as shown in FIG. 4D, an XY stage 21 is positioned such that a mark portion in a shot area to be subjected to alignment (mark position detection) on the waver W is located at the position of a slit image SB formed by a focus position detection system. A Z stage 20 is then servo-controlled to perform a focusing operation and servo lock in the same manner as in step 102 of FIG. 5. As a result, street lines on which wafer marks WMx and WMy are formed are focused at the position of the best image plane of the projection lens PL.

Subsequently, the XY stage 21 is moved to sequentially set the marks WMx and WMy on the wafer W in the states shown in FIGS. 4B and 4C, and the position of each of the marks WMx and WMy is detected on the basis of a mark detection signal from the wafer alignment system WA and a measured value from a laser interferometer IFM. In this case, particularly in the state shown in FIG. 4C, a CPX 30 reads in the level of a detection signal SZ via an ADC 301. In the state shown in FIG. 4C, the slit image SB formed by the focus position detection system is projected onto substantially the center of a chip area CP2. In this embodiment, therefore, the level of the detection signal SZ in the state of FIG. 4C corresponds to a positional deviation $\Delta Z_n$ in the Z direction on the surface of the central portion of the chip area with respect to the surfaces of the street lines on which the marks WMx and WMy are formed.

In global alignment in which the wafer W is positioned globally, it is generally required to detect wafer marks belonging to at least two shot areas on the wafer W, and so the above operation brings about the state shown in FIG. 4C at least twice for different shot areas. Therefore, the focus offset amount is determined by averaging the positional deviations $\Delta Z_n$ obtained for at least two portions.

If, however, the positional deviations $\Delta Z_n$ are to be detected similarly in two or more shot areas, the XY stage 21 need only be positioned as shown in FIG. 4C without executing mark detection. In addition, if the state of a portion precisely focused in a chip area is different from that shown in FIG. 4C, the route of movement of the XY stage 21 is set such that the slit image SB is projected onto a desired portion in the chip area while the wafer W is moved to the state shown in FIG. 4C.

As in this embodiment, when the level of a desired portion in a shot area is detected on the basis of the street lines in which the wafer marks are formed, it becomes unnecessary to perform a focusing operation and focus lock at the center (exposure state) of the shot area as shown in FIG. 4A. This advantageously reduces the number of times the XY stage 21 is moved and makes it possible to perform a focusing operation with respect to the marks during alignment. In addition, when the positional deviations $\Delta Z_n$ are detected nearly simultaneously with mark detection as in this embodiment, the positional deviations $\Delta Z_n$ can be obtained independently for each of all shot areas to be exposed in performing step-and-repeat exposure by die-by-die (each shot) alignment. Therefore, in the second and subsequent shots after exposure is started for the wafer W, an offset amount can be set by calculating an average value more accurately on the basis of a positional deviation $\Delta Z_n$ detected in an immediately preceding shot area and a positional deviation $\Delta Z_{n,n+x}$ detected when die-by-die alignment is performed for a current shot.

The third embodiment of the present invention will be described below with reference to FIG. 7. This embodiment is basically the same as the first and second embodiments described above except that global alignment of a wafer W is combined with an EGA (Enhancement Global Alignment) scheme. The EGA scheme is disclosed in detail in, e.g., U.S. Pat. Nos. 4,780,617 and 4,833,621, so a description of the principle of this scheme is omitted and only a sequence related closely to the present invention will be described below.

Figure 7:
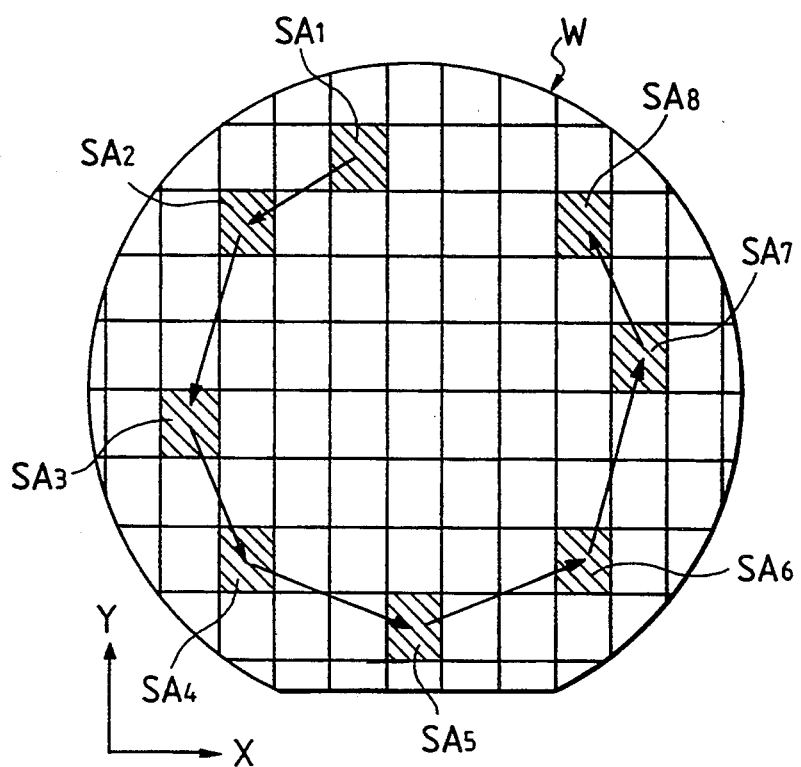
FIG. 7 is a view showing a practical example of the arrangement of sample shots formed on a wafer in accordance with an EGA scheme.

FIG. 7 shows an example of the arrangement of sample alignment shots according to the EGA scheme, in which shot areas indicated by hatched portions are sample shots $SA_1$ to $SA_8$ designated by the EGA. In the EGA scheme, a wafer alignment system WA detects wafer marks WMx and WMy belonging to each of the sample shots $SA_1$ to $SA_8$ in sequence in an order indicated by arrows in FIG. 7, measuring the positions of the individual marks. Thereafter, on the basis of a plurality of mark positions (coordinate positions of the sample shots) thus measured, the coordinate positions of all the shot areas on the wafer W are determined by arithmetic operations in accordance with a statistical method. The XY stage 21 is then stepped to perform exposure on the basis of the determined coordinate positions. The above processing is repeatedly executed in the EGA scheme.

In this embodiment, when the mark positions of the sample shots $SA_1$ to $SA_8$ are detected, positional deviations $\Delta Zn$ of portions requiring a precise focusing operation are also detected sequentially on the basis of the center of each shot area onto which a slit image SB formed by the focus position detection system is projected during exposure, as in the first or second embodiment described above. After selection based on a tolerance is performed for the detected positional deviations $\Delta Zn$ in the same manner as in the first second embodiment, the remaining positional deviations $\Delta Zn$ are averaged to yield a focus offset amount, and this offset amount is applied to the focus position detection system before exposure is executed by the step-and-repeat scheme.

With the above operation, since the deviations of portions requiring a truly precise focusing operation are detected at substantially the same time during sample alignment according to the EGA scheme, the focus offset can be determined without extremely reducing the throughput.

As has been described above, in each of the above embodiments of the present invention, the level of the detection signal SZ is fetched while the slit image SB formed by the focus position detection system, i.e., the sensor is at rest at a desired position in a shot area. The level of the detection signal SZ, however, is not necessarily fetched in this manner but may be digitally sampled at the instant the sensor traverses the desired position while the wafer W moves, provided that the electrical response is sufficiently high. Alternatively, the level of the detection signal. SZ may be sampled several times within a local area including the desired position in response to the up-down pulses from the laser interferometer IFM, and the average value of the sampled levels may be used as data of one positional deviation $\Delta Zn$.

In addition, when a plurality of wafers (lots) of the same process are to be processed in succession, the processing may be performed by measuring offset amounts for a plurality of (two or three) leading wafers and applying the average value of the focus offset amounts thus measured and determined for a plurality of leading wafers to the subsequent wafers, instead of determining a focus offset amount for each individual wafer by using the focus position detection system. This increases the processing speed as a whole because the operation of measuring the focus offsets need not be performed for the wafers processed subsequently to a plurality of leading wafers.

Furthermore, the level of the detection signal SZ from the PSD 17 is measured as the positional deviation $\Delta Zn$ in each of the above embodiments, but the value of the counter 312 which corresponds to the inclination of the plane parallel 12 can also be used. In this case, the inclination of the plane parallel 12 is corrected such that the level of the detection signal SZ is kept at zero when the wafer W is moved from a focus-locked position (at which the level of the detection signal is zero) to a desired position in a shot area. The resulting correction amount fetched from the counter 12 corresponds to the positional deviation $\Delta Zn$. This detection of the positional deviation $\Delta Zn$ performed by correcting the inclination of the plane parallel 12, however, is time-consuming although its precision (resolution) is very high. For this reason, when the undulations in a shot area must be measured with a high precision, it is desired that the deviation $\Delta Zn$ be measured from the inclination of the plane parallel 12.

What is claimed is:

1. A projection exposure apparatus comprising:

a projection optical system for projection-exposing a pattern of a mask onto a photosensitive substrate;

a stage for holding said photosensitive substrate, and for horizontally moving in a plane perpendicular to an optical axis of said projection optical system and vertically moving in a direction of the optical axis;

surface position detecting means for detecting, at a predetermined measurement point in a field of said projection optical system, a positional shift amount in the optical axis direction of the surface of said photosensitive substrate with respect to a reference plane set to substantially agree with a best image plane of said projection optical system;

focusing operation control means for vertically moving said stage during a focusing operation so that the positional shift amount becomes a predetermined value or less;

surface deviation measuring means for sequentially measuring n positional deviations in the optical axis direction between n first positions at substantially the centers of n specific local areas of a plurality of local areas on said photosensitive substrate to be exposed to a projected image of said pattern, and n second positions apart from the first positions by a predetermined amount in a predetermined direction and present in the n specific local areas, on the basis of the positional shift amount from said surface position detecting means;

calculating means for selecting m positional deviations falling within a predetermined tolerance from the n positional deviations and calculating an average value of the m selected positional deviations; and correcting means for correcting said surface position detecting means such that said reference plane is displaced in the optical axis direction by the calculated average value, wherein said focusing operation control means is operated in the corrected state, thereby performing a focusing operation for each local area of said photosensitive substrate when exposure is performed.

2. An apparatus according to claim 1, wherein the second positions are set at a plurality of locations in each of the local areas so as to be apart from the first positions by different distances in different directions, and said measuring means measures the positional deviation between each of a plurality of second positions and the first position in one local area and outputs an average value of a plurality of positional deviations measured in one local area as a representative positional deviation to said calculating means.

3. A projection exposure apparatus comprising:

a projection optical system for projection-exposing a pattern of a mask onto a photosensitive substrate;

surface position detecting means for detecting, at a predetermined measurement point in a field of said projection optical system, a positional shift amount in the optical axis direction of the surface of said photosensitive substrate with respect to a reference plane set to substantially agree with a best image plane of said projection optical system;

surface deviation measuring means for sequentially measuring n positional deviations in the optical axis direction between n first positions at substantially the centers of n specific local areas of a plurality of local areas on said photosensitive substrate to be exposed to a projected image of said pattern, and n second positions apart from the first positions by a predetermined amount in a predetermined direction and present in the n specific local areas, on the basis of the positional shift amount from said surface position detecting means; and correcting means for correcting said surface position detecting means such that said reference plane is displaced in the optical axis direction by a value corresponding to at least one of the n positional deviations.

4. A projection exposure apparatus comprising:

a projection optical system for projection-exposing a pattern of a mask onto one of a plurality of shot areas on a photosensitive substrate;

a stage for holding said photosensitive substrate, and for horizontally moving in a plane perpendicular to an optical axis of said projection optical system and vertically moving in a direction of the optical axis;

mark detecting means for photoelectrically detecting alignment marks formed in the shot areas on said photosensitive substrate via said projection optical system;

surface position detecting means for detecting a positional shift amount in the optical axis direction of the surface of said photosensitive substrate included in a detection area set at a predetermined position in a field of said projection optical system;

focusing operation control means for vertically moving said stage on the basis of the detected positional shift amount in order to perform a focusing operation;

positional deviation measuring means for, when said stage is horizontally moved to align said photosensitive substrate so that the marks formed in n particular shot areas on said photosensitive substrate are sequentially detected by said mark detecting means, setting in the detection area n first positions at substantially the centers of the n particular shot areas and n second positions apart from the first positions by a predetermined amount in a predetermined direction and present in the shot areas, and measuring a positional deviation in the optical axis direction between the first and second positions in each of the n shot areas;

calculating means for selecting n positional deviations falling within a predetermined tolerance from the n positional deviations and calculating an average value of the m selected positional deviations; and correcting means for correcting said surface position detecting means such that a position as a reference of the positional shift detection performed by said surface position detecting means is displaced in the optical axis direction by the calculated average value.

5. A projection exposure apparatus comprising:

a projection optical system for projection-exposing a pattern of a mask onto one of a plurality of shot areas on a photosensitive substrate;

mark detecting means for photoelectrically detecting alignment marks formed in the shot areas on said photosensitive substrate via said projection optical system;

surface position detecting means for detecting a positional shift amount in the optical axis direction of the surface of said photosensitive substrate included in a detection area set at a predetermined position in a field of said projection optical system;

positional deviation measuring means for, when said photosensitive substrate is horizontally moved to align said photosensitive substrate so that the marks formed in n particular shot areas on said photosensitive substrate are sequentially detected by said mark detecting means, setting in the detection area n first positions at substantially the centers the n particular shot areas and n second positions apart from the first positions by a predetermined amount in a predetermined direction and present in the shot areas, and measuring a positional deviation in the optical axis direction between the first and second positions in each of the n shot areas; and correcting means for correcting said surface position detecting means such that a position as a reference of the positional shift detection performed by said surface position detecting means is displaced in the optical axis direction by a value corresponding to at least one of the n positional deviations.

* * * * *